(12) United States Patent
Shapiro

(10) Patent No.: US 10,746,827 B2
(45) Date of Patent: Aug. 18, 2020

(54) MRI IMAGING SYSTEM USING PERMANENT MAGNET ARRAY

(71) Applicant: Clear-Cut Medical Ltd., Rehovot (IL)

(72) Inventor: Moshe Shapiro, Herzliya (IL)

(73) Assignee: CLEAR-CUT MEDICAL LTD., Rehovot (IL)

( * ) Notice: Subject to any disclaimer, the term of this patent is extended or adjusted under 35 U.S.C. 154(b) by 36 days.

(21) Appl. No.: 16/074,497

(22) PCT Filed: Feb. 5, 2017

(86) PCT No.: PCT/IB2017/050626
§ 371 (c)(1),
(2) Date: Aug. 1, 2018

(87) PCT Pub. No.: WO2017/134635
PCT Pub. Date: Aug. 10, 2017

(65) Prior Publication Data
US 2019/0041477 A1    Feb. 7, 2019

Related U.S. Application Data

(60) Provisional application No. 62/291,058, filed on Feb. 4, 2016, provisional application No. 62/330,942, filed on May 3, 2016.

(51) Int. Cl.
*G01R 33/383* (2006.01)
*G01R 33/30* (2006.01)
(Continued)

(52) U.S. Cl.
CPC .......... *G01R 33/383* (2013.01); *G01N 24/08* (2013.01); *G01R 33/307* (2013.01); *G01R 33/387* (2013.01); *G01R 33/48* (2013.01)

(58) Field of Classification Search
CPC .... G01R 33/307; G01R 33/30; G01R 33/383; G01R 33/48; G01R 33/387; G01N 24/08
(Continued)

(56) References Cited

U.S. PATENT DOCUMENTS 4,301,410 A * 11/1981 Wind ................. G01R 33/4816
324/307
4,305,036 A * 12/1981 Ernst .................... G01R 33/307
324/321
(Continued)

FOREIGN PATENT DOCUMENTS

WO    2008065389    6/2008
WO    2013142459    9/2013

OTHER PUBLICATIONS

PCT Search and Written Opinion PCT/IB32017/050626, dated Jun. 14, 2017.
(Continued)

*Primary Examiner* — Patrick Assouad
*Assistant Examiner* — Demetrius R Pretlow
(74) *Attorney, Agent, or Firm* — Dekel Patent Ltd.; David Klein

(57) ABSTRACT

A tissue imaging system (10) includes a stationary array of magnets (12) arranged to generate an inhomogeneous main magnetic field (B0), a tissue holder (16) adjacent the array of magnets (12) and operative to move tissue (14) placed therein about and/or along a coordinate axis, one or more RF receive coils (20) adjacent the tissue holder (16) and the magnets (12), and an MRI processor in communication with the magnets (12), the RF receive coils (20) and the tissue holder (16). An image of the tissue (14) is created by using spatial encoding of magnetic resonance signals generated by the magnets (12) and RF receive coils (20) for different spatial orientations of the tissue (14) moved by the tissue holder (16) with respect to the magnets. Spatial inhomoge-
(Continued)

neities in the main magnetic field spatially modulate a phase of each of the magnetic resonance signals.

5 Claims, 4 Drawing Sheets

(51) Int. Cl.
*G01N 24/08* (2006.01)
*G01R 33/387* (2006.01)
*G01R 33/48* (2006.01)

(58) Field of Classification Search
USPC .......................................................... 324/309
See application file for complete search history.

(56) References Cited

U.S. PATENT DOCUMENTS

| | | | | |
|---|---|---|---|---|
| H1218 H | * | 8/1993 | Cory | G01R 33/30 |
| | | | | 324/307 |
| 5,760,586 A | * | 6/1998 | Foerster | G01R 33/307 |
| | | | | 324/318 |
| 9,310,450 B2 | * | 4/2016 | Golan | G01R 33/30 |
| 9,689,817 B2 | * | 6/2017 | Golan | G01R 33/30 |
| 2005/0054910 A1 | * | 3/2005 | Tremblay | A61B 5/055 |
| | | | | 600/411 |
| 2008/0150525 A1 | * | 6/2008 | Song | G01N 24/08 |
| | | | | 324/307 |
| 2009/0128272 A1 | * | 5/2009 | Hills | G01R 33/383 |
| | | | | 335/306 |
| 2010/0059686 A1 | * | 3/2010 | Balakin | H01J 3/04 |
| | | | | 250/396 R |
| 2011/0089942 A1 | * | 4/2011 | Goodwill | A61B 5/05 |
| | | | | 324/301 |
| 2011/0221439 A1 | * | 9/2011 | Posse | A61B 5/055 |
| | | | | 324/307 |
| 2012/0299591 A1 | * | 11/2012 | Golan | G01R 33/30 |
| | | | | 324/309 |
| 2013/0082702 A1 | * | 4/2013 | Blumhagen | G01R 33/56563 |
| | | | | 324/309 |
| 2014/0111202 A1 | | 4/2014 | Wald | |
| 2014/0232391 A1 | * | 8/2014 | Kadayam Viswanathan | |
| | | | | G01V 3/32 |
| | | | | 324/303 |
| 2015/0061680 A1 | * | 3/2015 | Leskowitz | G01R 33/383 |
| | | | | 324/322 |
| 2015/0091564 A1 | * | 4/2015 | Golan | G01R 33/30 |
| | | | | 324/309 |
| 2016/0116614 A1 | * | 4/2016 | Watson | G01T 1/2985 |
| | | | | 250/363.03 |
| 2017/0007148 A1 | * | 1/2017 | Kaditz | A61B 5/055 |
| 2017/0011255 A1 | * | 1/2017 | Kaditz | G01R 33/48 |
| 2017/0285123 A1 | * | 10/2017 | Kaditz | G01R 33/5608 |
| 2019/0311506 A1 | * | 10/2019 | Wenzel | G06T 5/006 |
| 2019/0317168 A1 | * | 10/2019 | Popescu | G01R 33/4822 |

OTHER PUBLICATIONS

Clarissa Zimmerman Cooley et al: "Two-dimensional imaging in a lightweight portable MRI scanner without gradient coils", Magnetic Resonance in Medicine, vol. 73, No. 2, Mar. 25, 2014 (Mar. 25, 2014), US, pp. 872-883, XP055251174, ISSN: 0740-3194, DOI: 10.1002/mrm.25147.

Hornak J.P. et al.: "Surface MRI Using a Rastered Backprojection", Proceedings of the International Society for Magnetic Resonance in Medicine, 14th Scientific Meeting, Jun. 14, 2006 (Jun. 14, 2006), Seattle, USA, pp. 1354, XP040596871.

Wang P S et al: "Binder distribution in Si3N4 ceramic green bodies studied by stray-field NMR imaging", Journal of Materials Science UK, vol. 28, No. 18, Sep. 15, 1993 (Sep. 15, 1993), pp. 4940-4943, XP055378163, ISSN: 0022-2461.

\* cited by examiner

MRI IMAGING SYSTEM USING PERMANENT MAGNET ARRAY

FIELD OF THE INVENTION

The present invention relates generally to devices and methods for imaging tissues, such as an excised tumor or other tissue, and particularly to a magnetic resonance imaging (MRI) system that uses permanent magnets for the main magnetic field to image tissue.

BACKGROUND OF THE INVENTION

Breast cancer is usually treated with surgery and then possibly with chemotherapy or radiation, or both. There are two surgical options: mastectomy (removal of entire breast) and lumpectomy (removal of lump only). Lumpectomy is currently the most common treatment, suitable for at least 60% of women with breast cancer.

During lumpectomy, it is important to take out all cancerous tissue, in order to minimize the risk of cancer recurrence. However, surgeons avoid excision of unnecessarily large-tissue volumes, which negatively impacts cosmetic results. In order to verify that all cancerous tissue has been removed, the lump is pathologically examined in order to check if the lump's outer edges contain cancerous tissue or not (positive or negative margins). If positive margins are retrospectively detected on the lump during pathology, in many cases a repeated operation is necessary in order to take out additional tissue.

There is a significant unmet clinical need to provide breast cancer surgeons with a system that can indicate the margin status of excised breast lumps (including any additional "augmentation" pieces of breast tissue) during the surgical procedure, so that if needed, additional tissue can be excised, until all margins are indicated as negative.

PCT Patent Application PCT/US2011/023101 describes systems and methods for confirming the existence of a clean margin of healthy tissue around an excised tumor. The system includes an imaging scanner controlled by an imaging control unit and an ex-vivo sample holder for holding a sample of an excised tissue. The sample holder is sized so that excised lump edges of the excised tissue are forced against a surface of the sample holder such that the edges change shape to have a predetermined geometry. The imaging scanner is positioned relative to the sample holder such that the imaging scanner acquires images (or measurements) not of all the tissue but rather of the edges that have the predetermined geometry and which are in a sensitive region extending into a peripheral margin of the tissue.

US Patent Application 20140111202 describes a portable magnetic resonance imaging (MRI) system that spatially encodes images using spatial inhomogeneities in the static polarizing magnetic field rather than using gradient fields. The inhomogeneous static field is used to polarize, readout, and encode an image of the object. To provide spatial encoding, the magnet is rotated around the object to generate a number of differently encoded measurements.

SUMMARY OF THE INVENTION

The present invention also seeks to provide an MRI system that uses permanent magnets for volumetric mapping and imaging of a tissue, as described in more detail further below. The invention is described as a 2D imaging system but may be used as part of a 3D volume imaging system.

The invention is not restricted to imaging clean tissue margins at the tissue periphery; rather the invention can also provide volumetric mapping of the tissue sample with a fast speed of image acquisition. This is in contrast with the system of PCT/US2011/023101 which is slower and which can provide images only of the tissue periphery.

There is thus provided in accordance with an embodiment of the present invention a tissue imaging system including a stationary array of magnets arranged to generate an inhomogeneous main magnetic field ($B_0$), a tissue holder adjacent the array of magnets and operative to move tissue placed therein about and/or along a coordinate axis, one or more RF receive coils adjacent the tissue holder and the magnets, and an MRI processor in communication with the RF receive coils and the tissue holder, and operative to construct an image of the tissue by using spatial encoding of magnetic resonance signals generated by the magnets and RF receive coils for different spatial orientations of the tissue moved by the tissue holder with respect to the magnets, wherein spatial inhomogeneities in the main magnetic field spatially modulate a phase of each of the magnetic resonance signals.

The magnets may be arranged in a Halbach array or may be iron cored. The RF receive coils may be stationary or movable within the main magnetic field.

In accordance with an embodiment of the present invention the magnets may include magnetic yokes.

In accordance with another embodiment of the present invention the magnets include magnetic yokes connected to permanent magnets of a Halbach array.

In accordance with another embodiment of the present invention the magnets include permanent magnets and one or more shims.

In accordance with an embodiment of the present invention a method for magnetic resonance imaging including: a) arranging an object within a stationary array of magnets; b) generating a radio frequency (RF) field to the object to excite spins therein; c) receiving magnetic resonance signals responsive to the generated RF field from the object; d) moving the object to a different orientation with respect to said magnets; e) repeating steps b)-d) a plurality of times to receive magnetic resonance signals from the object at a plurality of different orientations; and f) reconstructing an image of the object from the received magnetic resonance signals.

BRIEF DESCRIPTION OF DRAWINGS

The present invention will be understood and appreciated more fully from the following detailed description, taken in conjunction with the drawings in which.

DETAILED DESCRIPTION OF EMBODIMENTS

Figure 1:
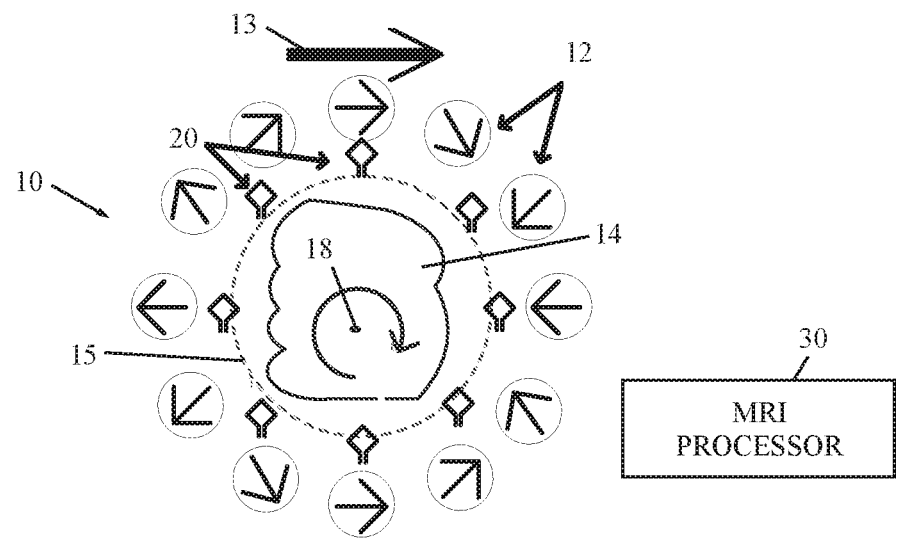
FIG. 1 is a simplified schematic illustration of a tissue imaging system, constructed and operative in accordance with a non-limiting embodiment of the present invention.

Reference is now made to FIG. 1, which illustrates a tissue imaging system 10, constructed and operative in accordance with a non-limiting embodiment of the present invention.

System 10 includes a stationary array of magnets 12 arranged to create a main magnetic field, which is the static magnetic field ($B_0$). The direction of the main magnetic field is indicated by arrow 13. Although the invention can be carried out with any kind of magnet, such as electromagnetic elements or a combination of permanent and superconducting magnets, in a preferred embodiment, magnets 12 are permanent magnets, such as but not limited to, iron or rare earth (e.g., neodymium-iron-boron or samarium-cobalt), or a combination thereof, with or without cores of magnetic material. In one embodiment, magnets 12 are permanent magnets, whose magnetic field may be shaped with materials such as Mu metals (nickel-iron soft magnetic alloys) cored with other magnetic material (e.g., a soft magnetic material such as iron), which results in an inhomogeneous polarizing field (main magnetic field).

Figure 3:
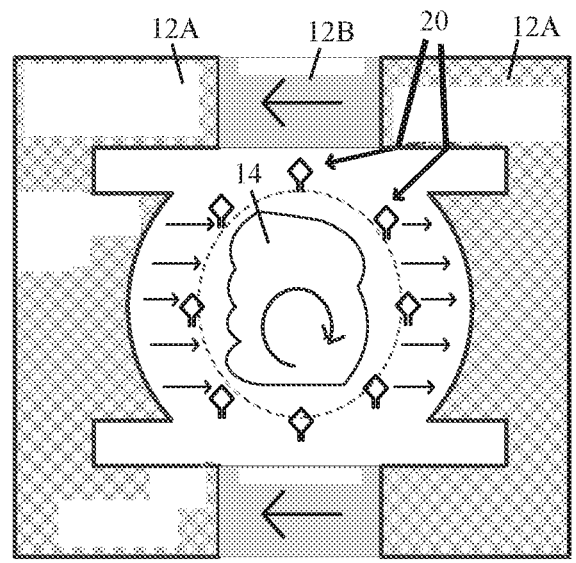
FIG. 3 is a simplified schematic illustration of a tissue imaging system, constructed and operative in accordance with another non-limiting embodiment of the present invention, in which a pair of magnetic yokes and permanent magnets are employed (e.g., "iron cored" topology)
Figure 4:
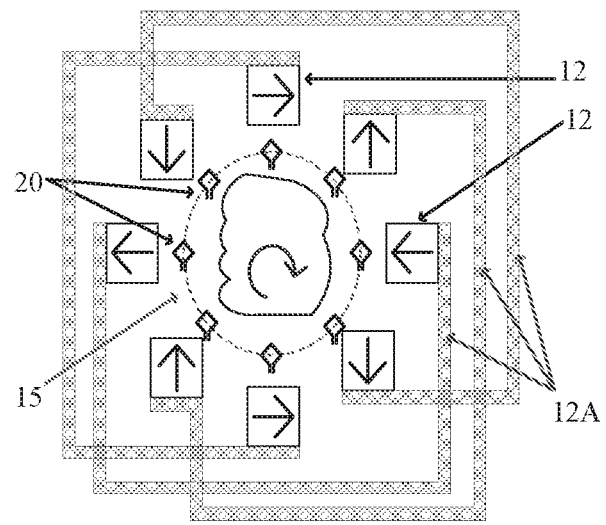
FIG. 4 is a simplified schematic illustration of a tissue imaging system, constructed and operative in accordance with another non-limiting embodiment of the present invention, in which magnetic yokes are connected to permanent magnets of a Halbach array.

In the embodiment illustrated in FIG. 1, the magnets 12 are permanent magnets arranged in a Halbach array (e.g., cylindrical array). FIG. 3 illustrates another embodiment, in which a pair of magnetic yokes 12A, which may be made of high permeability materials such as Mu metals (nickel-iron soft magnetic alloys) cored with other magnetic material (e.g., a soft magnetic material such as iron), are placed on either side of the tissue 14 and permanent magnets 12B are placed between the yokes 12A. FIG. 4 illustrates yet another embodiment, in which magnetic yokes 12A are connected to permanent magnets 12 of the Halbach array. The term "yoke" as used herein encompasses any arrangement of magnets with air gaps (such as H-shapes, C-shapes and other shapes, with or without the addition of magnetic material cores.

Figure 2:
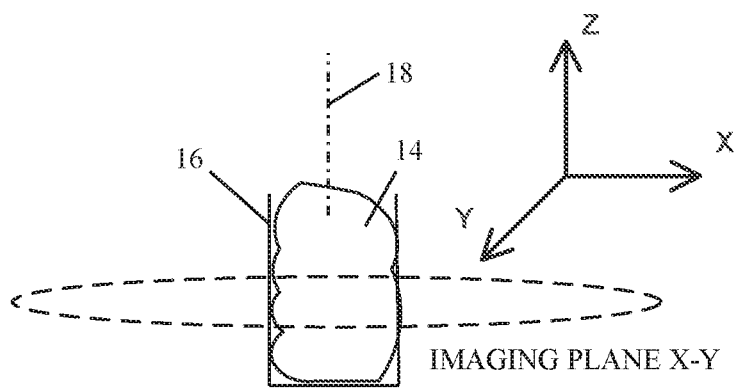
FIG. 2 is a simplified pictorial illustration of the global coordinate system for imaging, in accordance with an embodiment of the present invention.

Reference is now made to FIG. 2, which illustrates the global coordinate system for imaging. The 2D imaging plane is the x-y plane, and each tissue slice is taken along the z axis. A tissue sample 14 is disposed in a tissue holder 16, which is rotatable about a rotation axis 18, such as the symmetry axis of holder 16, and/or translatable along any coordinate axis.

Referring again to FIG. 1, one or more RF receive coils 20 may be mounted adjacent to the tissue 14 and the magnets 12. In the illustrated embodiment, there are more magnets 12 than RF receive coils 20, but in other embodiments there may be the same number of RF receive coils as magnets, or alternatively, there may be more RF receive coils than magnets. In one embodiment, each RF receive coil 20 may be mounted between the tissue 14 and one of the magnets 12.

In another embodiment, one or more of the RF receive coils 20 may be mounted between magnets 12.

The RF receive coils 20 collect a time-varying RF ($B_1$) magnetic field perpendicular to the $B_0$ field, for example, pointing towards the center of tissue sample 14. The RF receive coils 20 may be large enough relative to the sample height so that the intensity of the $B_1$ field is relatively constant throughout the height of the sample. The RF receive coils 20 sense nuclear spins (which may be excited by transmit coils, not shown) in the tissue sample for magnetic resonance as is well known to the skilled artisan. The system images a field of view (FOV), as indicated by arrow 15 in FIG. 1. A magnetic resonance imaging processor 30 is in communication with RF receive coils 20 and tissue holder 16.

In contrast to the system of PCT/US2011/023101, the present invention does not need to employ gradient coils to create the MR images. Rather, in this embodiment, the spatial encoding is based on the main magnetic field's inhomogeneity, which is used to polarize, readout, and encode an image of the tissue 14. If the main magnetic field is non-linear, then in order to resolve the non-linear spatial encoding, the imaged tissue 14 is rotated and/or translated within the static main magnetic field and signals are collected from the RF receive coils 20. The RF receive coils 20 may either be stationary or may be rotated or displaced within the static magnetic field. This is in contrast to the system of US Patent Application 20140111202, in which the magnets are rotated and the imaged object is stationary and cannot be rotated.

The inhomogeneous magnetic field of magnets 12 serves to polarize the tissue 14 to be imaged and to readout magnetic resonance signals. Tissue 14 is moved (rotated and/or translated) after each image acquisition, such that tissue 14 has a different spatial orientation for each image acquisition. For example, the first acquisition might have the $B_0$ field oriented transversely from left-to-right through the tissue 14. The tissue 14 is then subsequently moved to different spatial orientations, each with a unique magnetic field orientation. The spatial inhomogeneities in the magnetic field generated by magnets 12 spatially modulate the magnetic resonance signal phase, such that in conjunction with the rotation and/or translation provides spatial encoding of the signals that can be used to construct an image of the tissue 14. The Halbach array configuration of the magnets naturally forms a nonlinear magnetic field whose variation in Larmor frequency (which may vary about 50-100 KHz over the FOV) can be used for spatial encoding, as is known in the art.

The spatial localization of magnetic resonance signals is improved by using the RF receive coils 20. Information from the RF receive coils 20 may be used to reconstruct an image in a process analogous to parallel imaging in conventional MRI. During image construction, the spatially varying coil sensitivities are incorporated directly into the encoding matrix. Further image encoding can also be achieved by limiting the bandwidth of the RF excitation pulse used. In this case, the excitation is limited to a constrained "onion-shell" of spatial regions, which may be useful for imaging clean tissue margins.

Figure 5:
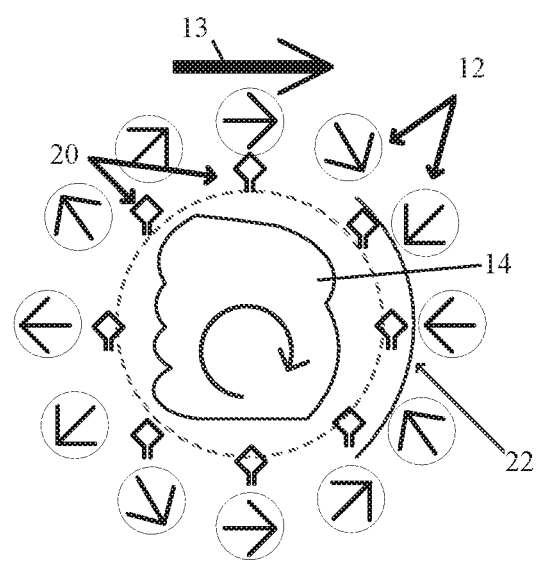
FIG. 5 is a simplified schematic illustration of a tissue imaging system, constructed and operative in accordance with another non-limiting embodiment of the present invention, with the addition of one or more shimming magnets (e.g., permanent magnet) or other magnetic materials (e.g., iron sheet)

Reference is now made to FIG. 5, which illustrates the embodiment of FIG. 1, but with the addition of one or more shims 22, which may be an iron or Mu metal sheet or a permanent magnet. In this MRI system, the main magnetic field is generated by the set of permanent magnets 12 shimmed by shim(s) 22 so that a linear field is attained in a way that uses the static magnetic field's permanent, uniform gradient for encoding the spatial location of nuclear spins. This uniform gradient can enable using uniform, gradient-dependent MRI contrast parameters, such as ADC (Apparent Diffusion Coefficient), to be imaged. The spatial encoding may be based on the main magnetic field's permanent gradient as a readout gradient while the relative rotation between the permanent gradient and the imaged tissue is carried out for a polar phase encoding gradient. To resolve the polar spatial encoding, MR signals are collected from the one or more RF receive coils 20 at different rotation angles of the tissue 14 in a "projection reconstruction" scheme.

The magnetic field may be homogenous in the z direction so that there are only permanent gradients in the 2D imaging plane alone. This is obtained by using the permanent magnets 12 and shim(s) 22 which are generally constant in the z direction.

The magnetic field in the x-y plane may have a single vector component in the FOV (or at least with other negligible components) so that imaging may be possible without resorting to complicated processing techniques.

The goal of shimming is to provide a field which is as linear as possible, i.e., the local gradient is almost constant in magnitude and direction. Realistically it is understood that a certain amount of residual inhomogeneity is present.

The gradient value takes into consideration the T2*-ADC relation so that the resulting value enables a reasonable T2* fit for each pixel (a zero gradient disables diffusion expression). An accurate local "effective gradient" may be measured so that the T2* map attained for each pixel may be transformed to a uniform ADC value which depends only on the tissue microstructure.

Slice selection may be based upon on the transmit coil's z axis sensitivity. Alternatively, slice selection may be based upon a z direction gradient or other slice encoding schemes.

Figure 6:
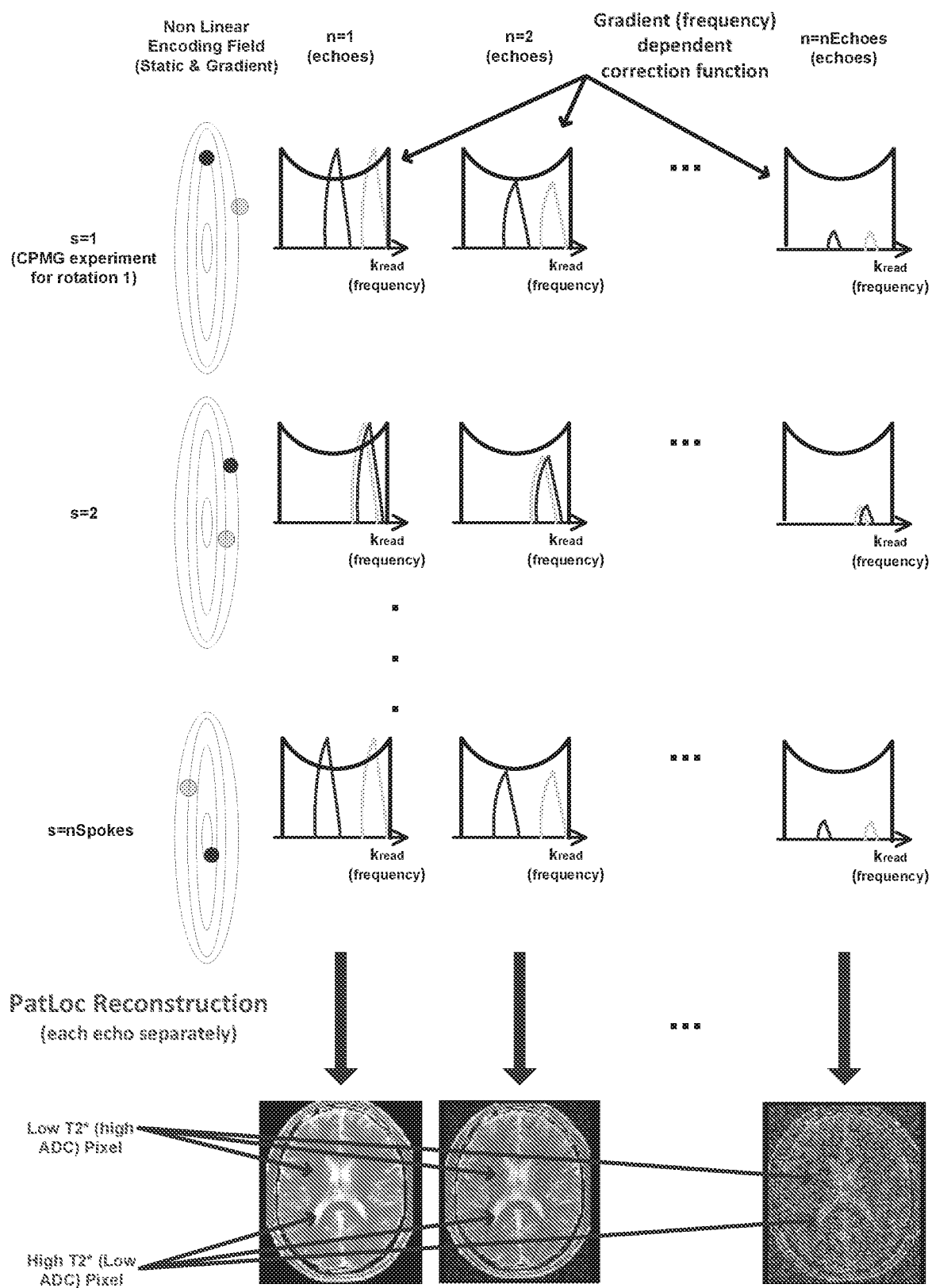
FIG. 6 is a simplified illustration of a method for imaging using PATLOC and resolving ambiguous spatial encoding magnetic fields by relative rotation or displacement, in accordance with an embodiment of the invention, FIG. 6 being a graphical illustration of PATLOC acquisition, showing CPMG spin-echo sequences and images constructed therefrom.

Reference is now made to FIG. 6, which illustrates a method for imaging using PATLOC and resolving ambiguous spatial encoding magnetic fields by relative rotation or displacement, in accordance with an embodiment of the invention.

PATLOC (Parallel Imaging Technique Using Localized Gradients) is a method for attaining MR images in a heterogeneous encoding field, in which there is no single, uniform gradient in the entire imaging domain but rather a "local" gradient for each spatial point. The heterogeneous encoding field may be created either by heterogeneous polarizing fields or by nonlinear gradient coil responses. The heterogeneous encoding field may have a non-unique spatial encoding, so this ambiguous encoding must be resolved. In PATLOC, the spatial encoding magnetic fields (SEMs) are inherently ambiguous because they produce a non-bijective correlation between k-space and the image domain.

In order to resolve the ambiguity, in the prior art, a multiple receiver RF coil array is typically used for data acquisition. In general, the number of receiver elements in the RF coil array is equal to or greater than the degree of ambiguity present in the SEM.

In one embodiment of the present invention, a method of resolving the ambiguous spatial encoding includes recording the received signals with a plurality of receiver RF coils and rotating or displacing the imaged object with respect to the encoding field. Again, in contrast to the system of US Patent Application 20140111202, in the present invention, the encoding field and the object are rotated or displaced relative to each other (the object is also moved), and the MR image contrast mechanism is gradient affected (e.g., diffusion weighted MRI).

In this embodiment, the encoding magnetic field employs a plurality of magnets (either permanent or other), possibly in conjunction with gradient coils to create an inhomogeneous magnetic field (encoding magnetic field) with a specific relationship between the field and its gradient. (This may be done as described above in FIGS. 1-5, in which the inhomogeneous magnetic field of magnets 12 serves to polarize the tissue 14 to be imaged and to readout magnetic resonance signals.) The relationship between the field and its gradient is characterized in a way that all spatial locations with a certain field magnitude share a similar gradient level (optimally they should be equal but a certain gradient variation is natural and the greater the variation the greater the error in correction).

Spatial encoding may be based on the main magnetic field's inhomogeneity or by using heterogeneous gradient fields (together comprising the SEM). Thus, an inhomogeneous field is used to polarize, readout, and encode an image of the object.

To resolve the non-linear spatial encoding, the imaged object may be either rotated or displaced within the encoding magnetic field and signals collected from a plurality of RF receiver coils (again as described above for FIGS. 1-5). The received signals from each rotation\displacement step may be corrected as described below (Local Gradient Correction Method). The receive coils may either be stationary or may be rotated or displaced within the encoding magnetic field.

Local Gradient Correction Method—For a certain specimen voxel, experiencing a different local gradient at each rotation step, the gradient's effect on the MR experiment may be normalized by applying a different correction to each frequency component (corresponding to each encoding field's magnitude) according to a predefined gradient calculation (by pure calculation, measurement, calibration, etc.) corresponding to the field's magnitude. This is possible considering the special relationship between the field and its gradient as described above. For each frequency component the correction may be performed according to the way the gradient's value affects the image contrast (see the Apparent Diffusion Coefficient Example below) and can be applied in any case the gradient's value can be characterized in the image contrast (such as by contrast weighting by an analytical formula, iterative correction, etc.). Data collected from different rotations/displacements of the specimen may be normalized and combined with a gradient-based contrast to reconstruct an image from different acquisitions which took place while the same specimen voxel experienced different local gradients.

Apparent Diffusion Coefficient (ADC) Example

Recalling the time decay formula of the diffusion term in the Bloch equation (in MRI, a Bloch equation is a member of a set of macroscopic equations that are used to calculate the nuclear magnetization $M=(M_x, M_y, M_z)$ as a function of time when relaxation times T1 and T2 are present), the analytical relation between the magnetization dephasing time constant (T2*), the apparent diffusion coefficient and the gradient is given by:

$$T_2^* = \left[\frac{1}{T_2} + \frac{1}{3} \cdot \gamma^2 G^2 \tau^2 D\right]^{-1}$$

where G is the local gradient (which in the general case may be frequency dependent since it may correspond to a certain encoding field magnitude), T2 is the spin-spin relaxation time constant, γ the gyromagnetic ratio, τ the echo time and D is the ADC. In order to attain an ADC weighted T2* contrast the echo time is chosen so that T2 is negligible in the formulation of T2*. In this example T2* is attained by fitting the echoes from a CPMG (Carr-Purcell-Meiboom-Gill) sequence doing this by evaluating each pixel's time decay individually (T2* and ADC is calculated for each pixel individually). For an acquisition performed in a heterogeneous encoding field, a CPMG sequence MR experiment is performed at each step of the rotation. Each echo's spectrum is normalized (by a predefined frequency dependent correction function such as an inverse of the above equation considering the relation between the gradient and frequency). The PATLOC scheme is then utilized to reconstruct an independent image for each echo.

FIG. 6 is a graphical illustration of PATLOC acquisition, showing CPMG spin-echo sequences and images constructed therefrom, Afterwards a 'T2* like' calculation (of the gradient normalized T2*) may be performed for each pixel (taken from multiple images) finally forming a normalized T2* (or ADC weighted) map.

What is claimed is:

1. A tissue imaging system comprising:
    a stationary array of magnets arranged to generate an inhomogeneous main magnetic field ($B_0$);
    a tissue holder adjacent said array of magnets and operative to move tissue placed therein about and/or along a coordinate axis;
    one or more RF receive coils adjacent said tissue holder and said magnets; and
    an MRI processor in communication with said RF receive coils and said tissue holder, and operative to construct an image of the tissue by using spatial encoding of magnetic resonance signals generated by said magnets and RF receive coils for different spatial orientations of said tissue moved by said tissue holder with respect to said magnets, wherein spatial inhomogeneities in the main magnetic field spatially modulate a phase of each of the magnetic resonance signals, wherein said magnets comprise magnetic yokes connected to permanent magnets of a Halbach array.

2. The tissue imaging system according to claim 1, wherein said one or more RF receive coils are stationary.

3. The tissue imaging system according to claim 1, wherein said one or more RF receive coils are movable within said main magnetic field.

4. The tissue imaging system according to claim 1, wherein said magnets comprise permanent magnets and one or more shims.

5. A method for magnetic resonance imaging comprising:
    a) arranging an object within a stationary array of magnets, where said magnets comprise magnetic yokes connected to permanent magnets of a Halbach array;
    b) generating a radio frequency (RF) field to the object to excite spins therein;
    c) receiving magnetic resonance signals responsive to the generated RF field from the object;
    d) moving the object to a different orientation with respect to said magnets;
    e) repeating steps b)-d) a plurality of times to receive magnetic resonance signals from the object at a plurality of different orientations; and
    f) reconstructing an image of the object from the received magnetic resonance signals.

* * * * *